(12) United States Patent
Soundarapandian et al.

(10) Patent No.: US 6,501,411 B2
(45) Date of Patent: Dec. 31, 2002

(54) SYSTEM AND METHOD FOR OPTIMIZING POWER IN PIPELINED DATA CONVERTERS

(75) Inventors: Karthikeyan Soundarapandian, Dallas, TX (US); Eric G. Soenen, Plano, TX (US); T. Lakshmi Viswanathan, Addision, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/848,635

(22) Filed: May 3, 2001

(65) Prior Publication Data

US 2002/0167433 A1 Nov. 14, 2002

(51) Int. Cl.⁷ .................................................. H03M 1/38
(52) U.S. Cl. ....................................... 341/161; 327/102
(58) Field of Search ........................ 341/161; 327/132, 327/137, 140, 91, 94, 102

(56) References Cited

U.S. PATENT DOCUMENTS 5,736,879 A * 4/1998 Pham .......................... 327/102
5,841,301 A * 11/1998 Horie et al. ................. 327/100
5,955,903 A * 9/1999 Pham .......................... 327/132
6,020,769 A * 2/2000 Vallancourt ................... 327/94

* cited by examiner

Primary Examiner—Peguy JeanPierre
Assistant Examiner—Joseph J Lauture
(74) Attorney, Agent, or Firm—William B. Kempler; W. James Brady; Frederick J. Telecky, Jr.

(57) ABSTRACT

A pipelined data converter current biasing system employs a frequency-to-voltage converter (FVC) operational to convert a plurality of desired sampling frequencies to a plurality of output voltages and a voltage-to-current (V to I) converter operational to convert the plurality of output voltages to a plurality of bias currents. The plurality of bias currents function to bias the data converter operational amplifiers such that the data converter power consumption is dependent on the plurality of sampling frequencies in a way that optimizes power consumed by the data converter with respect to the sampling frequency.

25 Claims, 4 Drawing Sheets

SYSTEM AND METHOD FOR OPTIMIZING POWER IN PIPELINED DATA CONVERTERS

BACKGROUND OF THE INVENTION

1. Field of the Invention

This invention relates generally to pipelined data converters, and more particularly to a system and a method for optimizing the power consumed by a pipelined analog-to-digital converter (ADC) with respect to the sampling frequency at which it is operating.

2. Description of the Prior Art

Any high performance pipelined ADC designed in accordance with a particular sampling frequency specification is optimized for that sampling frequency with respect to power consumption. Such an ADC therefore consumes unnecessary extra power while operating at sampling frequencies that are lower than the optimal highest sampling frequency. In view of the foregoing, there is a need in the pipelined data converter art for a technique to optimize the power consumed by the data converter with respect to the sampling rate.

SUMMARY OF THE INVENTION

To meet the above and other objectives, the present invention provides a system and method for optimizing the power consumed by a pipelined data converter with respect to the sampling rate at which it is operating.

In one aspect of the invention, a data converter bias current control circuit is provided to adjust the bias current associated with a pipelined ADC such that ADC power consumption is optimized over a range of sampling frequencies.

In another aspect of the invention, a self-adaptive biasing scheme is provided to optimize power consumption for a pipelined ADC with respect to sampling frequency.

According to embodiment of the present invention, a data converter bias circuit comprises a frequency-to-voltage converter (FVC) operational to convert a plurality of sampling frequencies to a plurality of output voltages, and a voltage-to-current (V to I) converter operational to convert the plurality of output voltages to a plurality of bias currents, wherein the plurality of bias currents operate to bias operational amplifiers associated with the data converter such that data converter power consumption is reduced with decreasing sampling frequencies. One embodiment of the FVC comprises a lossy integrator configured to generate the plurality of output voltages such that the plurality of output voltages comprise of a varying component proportional to the input frequency on top of a DC component. One embodiment of the data converter bias circuit further comprises DC component removal circuitry configured to process the plurality of bias currents such that the DC components are substantially eliminated from the plurality of bias currents.

BRIEF DESCRIPTION OF THE DRAWINGS

Other aspects and features of the present invention, and many of the attendant advantages of the present invention, will be readily appreciated as the same become better understood by reference to the following detailed description when considered in connection with the accompanying drawings in which like reference numerals designate like parts throughout the figures thereof and wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1A:
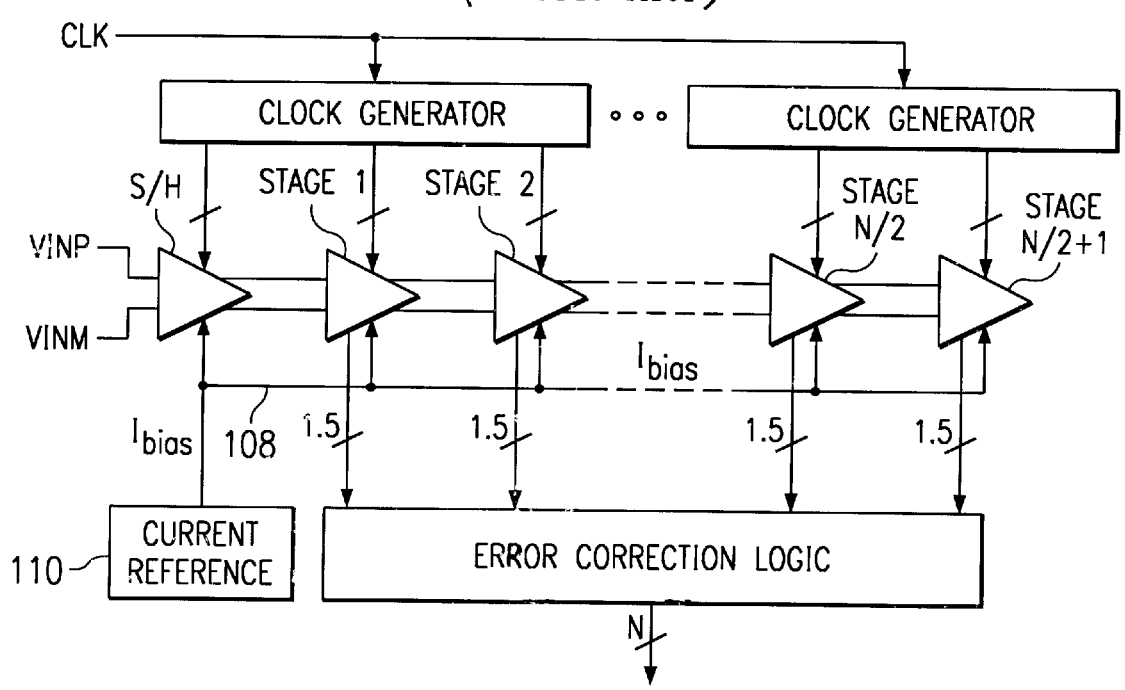
FIG. 1a is a simplified block diagram illustrating a single bit per stage pipelined ADC that is known in the art.
Figure 1B:
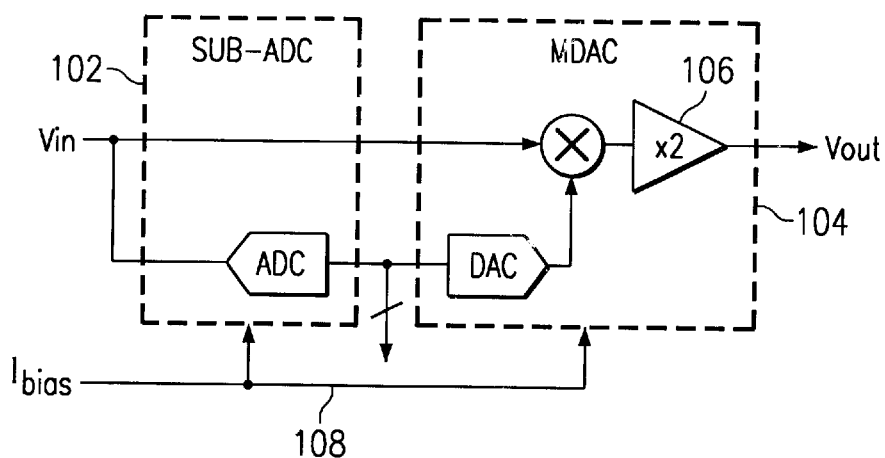
FIG. 1b is a simplified block diagram illustrating a single stage of the pipelined ADC shown in FIG. 1a and that includes a sub-ADC and a MDAC portion.
Figure 1C:
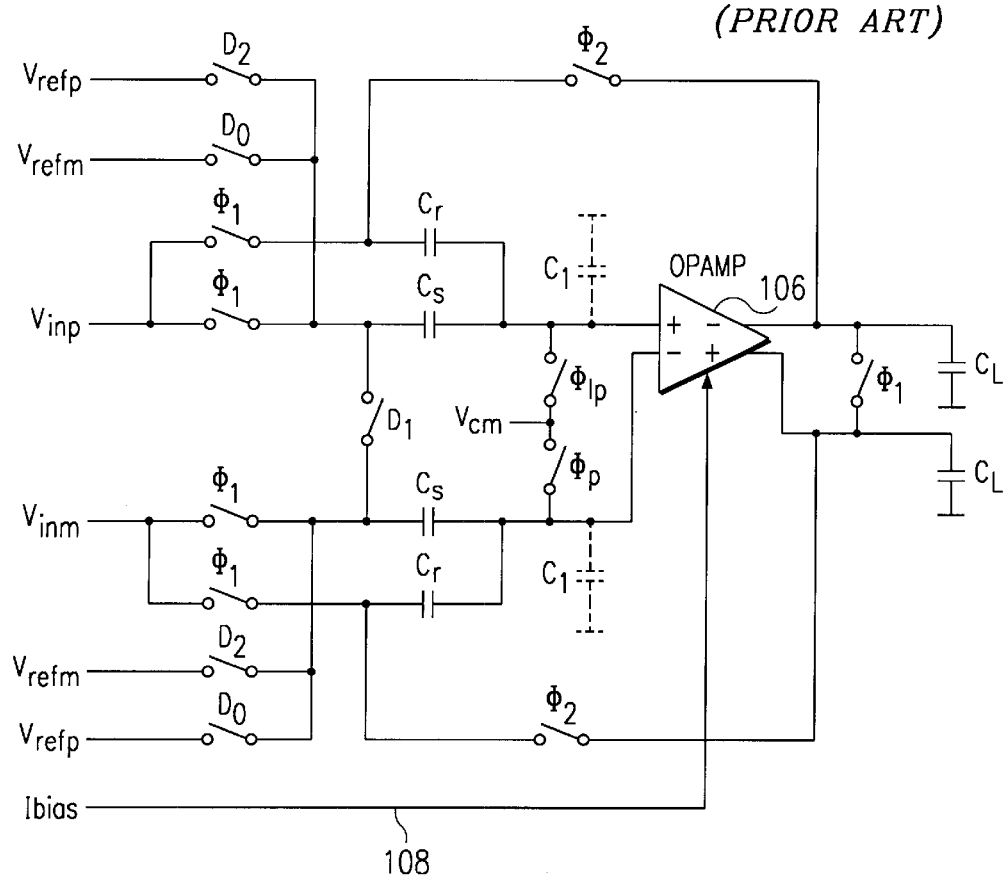
FIG. 1c is a schematic diagram illustrating the MDAC portion of the single stage shown in FIG. 1b.

FIG. 1a is a simplified block diagram illustrating a single bit per stage pipelined ADC 100 that is known in the art, while FIG. 1b is a simplified block diagram illustrating a single stage of the pipelined ADC shown in FIG. 1a and that includes a sub-ADC 102 and a multiplying DAC (MDAC) 104 portion; and FIG. 1c is a schematic diagram illustrating the MDAC 104 portion of the single stage shown in FIG. 1b. Any high performance pipelined analog-to-digital converter (ADC) designed for a particular sampling frequency specification is optimized for that sampling frequency, with respect to power consumption. While operating at lower sampling frequencies therefore, the ADC unnecessarily consumes extra power. The present inventors recognized this extra power could be reduced by appropriately adjusting the biasing current of the ADC.

The main power consuming blocks in a pipelined ADC are the operational amplifiers 106 in the MDAC 104, which are generally biased via a bias current 108 from a current reference generator 110. Higher sampling frequencies require a higher operational amplifier bandwidth, and hence more bias current. The present inventors further recognized if the bias currents of the operational amplifiers (opamps) 106 are adjusted according to the sampling frequency, then a self-adaptive biasing scheme can be implemented for the pipelined ADC 100, wherein the power consumption is optimized with respect to the sampling frequency.

Figure 2:
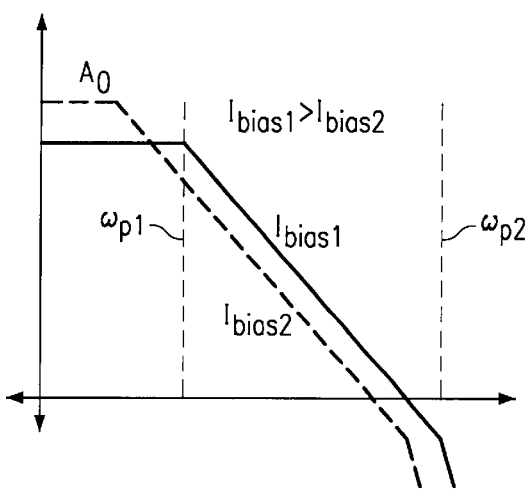
FIG. 2 is a diagram illustrating the frequency response of an operational amplifier (opamp) with changing bias current.

A detailed description of one embodiment of the present invention is then set forth below by first assuming that the opamp 106 of the ADC 100 is originally designed to operate at the highest frequency, and that we are trying to optimize the power for the lower operating frequencies. Relationships between the main performance parameters of an opamp and the bias current are well known. Opamp gain, for example, is inversely proportional to the square root of the bias current. This implies that reducing the bias current increases the gain and hence improves the settling accuracy. Opamp bandwidth is directly proportional to the square root of the bias current. So reducing the bias current reduces the bandwidth quadratically. FIG. 2 is a diagram illustrating the frequency response of an operational amplifier with changing bias current.

Figure 3:
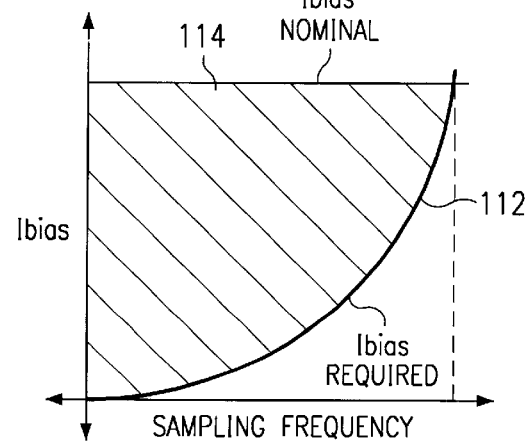
FIG. 3 is a diagram illustrating the relationship between sampling frequency and the minimum bias current necessary for an opamp to achieve a specific dynamic range.

Assuming then that the all the transistors of the opamp are operating in the saturation region and that it is not slew rate limited, reducing the bias current of the opamp reduces the maximum sampling frequency quadratically. FIG. 3 is a diagram illustrating the relationship between sampling frequency and the minimum bias current necessary for the opamp to achieve a specific dynamic range. Specifically, FIG. 3 depicts the actual bias current required theoretically versus the bias current in a typical ADC. The shaded area 114 represents the excess power being consumed by the ADC.

Figure 4:
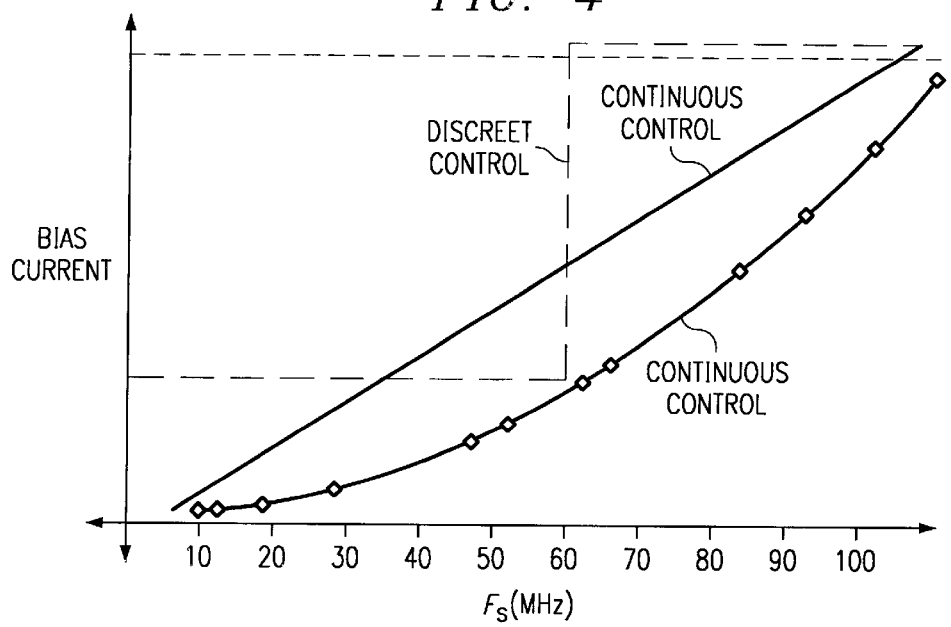
FIG. 4 is a diagram illustrating different approaches to power optimization in association with varying sampling frequencies.

Although a current reference generator that would mimic the quadratic curve 112 would be an ideal realization of the biasing scheme, implementation of such an accurate biasing scheme is likely to require significant circuitry, and hence, a substantial amount of power. Also temperature and process variations would affect the transfer function. FIG. 4 is a diagram illustrating different approaches to power optimization in association with varying sampling frequencies. Specifically, FIG. 4 depicts the two main approaches (discrete control and continuous control) by which power optimization could be achieved. The discrete control approach would be more optimal for a wide range of sampling frequencies. By increasing the number of threshold levels, better optimization can be achieved. The discrete control approach is problematic however in that it would need very high accuracy comparators to define the threshold levels accurately. Even with the best available comparator, until and unless the number of quantization levels is very large, there will be discontinuity around the threshold levels. Also as the number of comparators increase, the power consumption and the area are increased and thereby the whole purpose of power optimization would be lost.

The second approach is the continuous control approach that could be linear or quadratic, or even specific to the particular ADC. The simplest implementation is a linear control. Implementation of such a linear control for a 10-bit, 100 MHz ADC core is now set forth herein below with reference to FIGS. 5–7.

In view of the foregoing, it can be appreciated that the power consumed by the control circuitry must be very small compared to the total ADC power consumption. It can also be appreciated that the accuracy of the bias current magnitude generated by the biasing scheme is not critical so long as it is more than necessary for the proper operation of the opamp at a particular sampling frequency.

Figure 5:
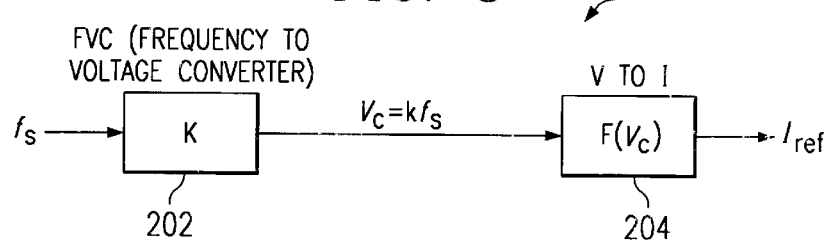
FIG. 5 is a simplified block diagram illustrating a biasing scheme in accordance with one embodiment of the present invention and that includes a frequency-to-voltage converter (FVC) driving a voltage-to-current (V to I) converter.
Figure 6A:
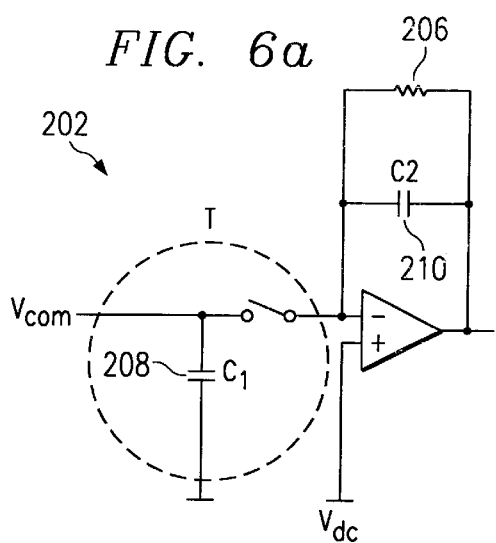
FIG. 6a is a simplified schematic diagram of the FVC shown in FIG. 5 according to one embodiment that illustrates the charging state of the FVC.
Figure 6B:
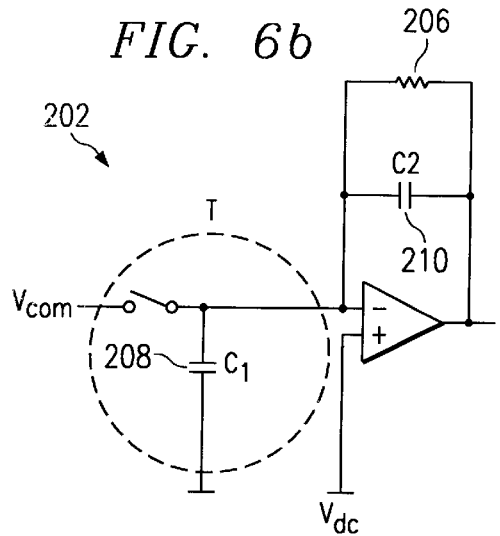
FIG. 6b is a simplified schematic diagram of the FVC shown in FIG. 5 according to one embodiment that illustrates the discharging state of the FVC.
Figure 6C:
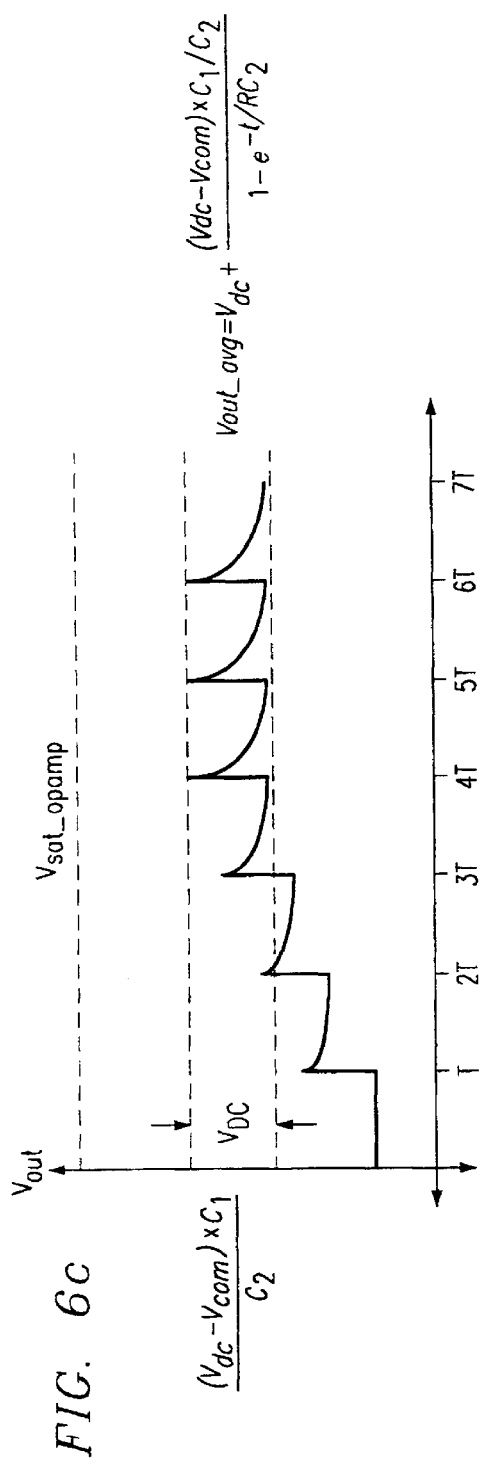
FIG. 6c is a simplified diagram illustrating the operation of the FVC shown in FIG. 5.

Looking now at FIG. 5, a simplified block diagram illustrates a biasing scheme 200 in accordance with one embodiment of the present invention and that includes a frequency-to-voltage converter (FVC) 202 driving a voltage-to-current (V to I) converter 204. FIG. 6a is a simplified schematic diagram of the FVC 202 shown in FIG. 5 according to one embodiment that illustrates the charging state of the FVC 202; while FIG. 6b is a simplified schematic diagram of the FVC 202 shown in FIG. 5 according to one embodiment that illustrates the discharging state of the FVC 202. The FVC 202 shown in FIGS. 6a and 6b is a lossy integrator where the resistor 206 in the feedback accounts for the loss. During one phase (phase one) of the clock, capacitor C1 (208) charges to Vcom. At the start of the other phase (phase two), the charge stored in capacitor C1 (208) is transferred on to capacitor C2 (210). Later on, during phase two, the charge on capacitor C2 (210) starts discharging through the resistor 206 in an exponential manner. The values of capacitors C1 (208), C2 (210) and resistor 206 are most preferably chosen such that the value of output voltage is within the common mode range of the opamp 212 in the V to I converter 204. FIG. 6(c) shows the behavior of the output voltage of the FVC. According to one embodiment, the output voltage Vout of the FVC 202 can be set forth as equation (1) below wherein $$V_{out} = V_{dc} + \frac{(V_{dc} - V_{com}) \times C_1/C_2}{1 - e^{-t/RC_2}}. \quad (1)$$

where t represents the sampling time period, which is the inverse of the sampling frequency f. For very small values of $t/RC_2$, the term $1/(1-e^{-(t/RC_2)})$ can then be approximated as $RC_2/t$, which is equal to $RC_2f$. The output voltage of the FVC 202 is therefore proportional to the input clock frequency. This FVC 202 output voltage generally has a DC ($V_{dc}$) component associated with it that can be removed in the V to I converter 204 in a manner described herein below with reference to FIG. 7. The average of the FVC 202 output voltage can be obtained by having a low pass filter at the output. A simple implementation of the filter would be a three pole RC filter that may form a portion of the FVC 202 itself.

Figure 7:
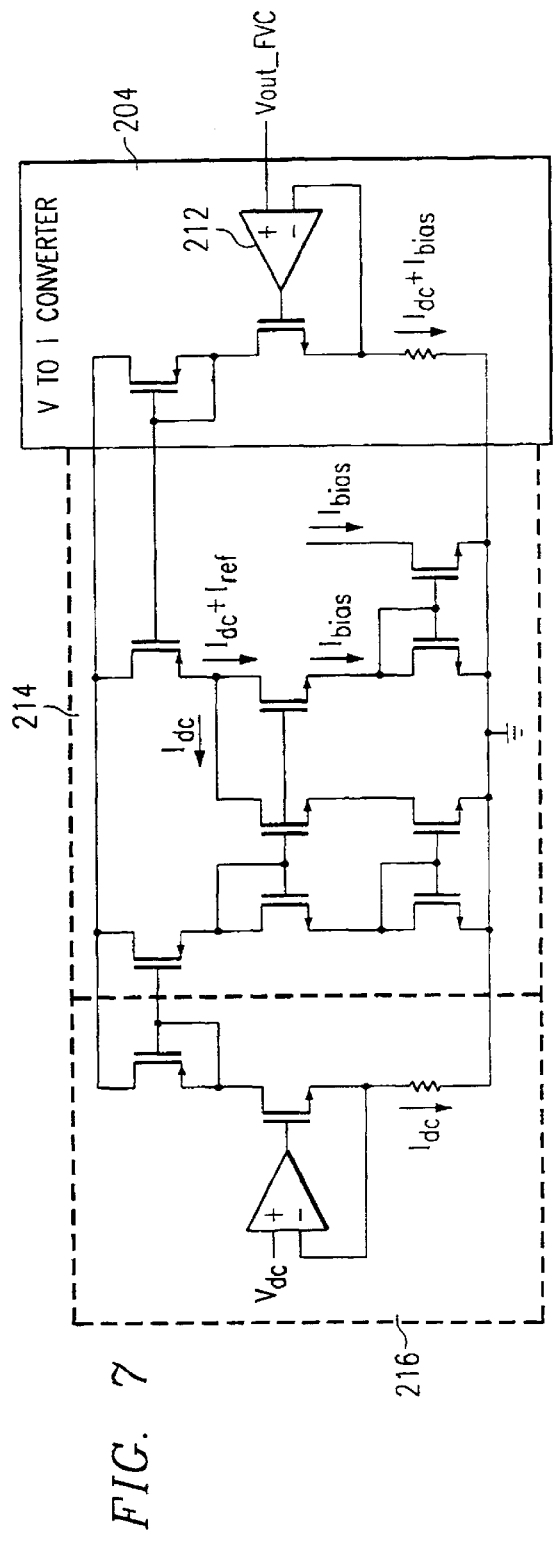
FIG. 7 is a schematic diagram of the V to I converter shown in FIG. 5 according to one embodiment that also illustrates one technique for removing the DC component of the FVC output.

FIG. 7 shows a schematic diagram of the V to I converter 204 depicted in FIG. 5 according to one embodiment that also illustrates one technique for removing the DC component of the FVC 202 output. The V to I converter 204 can be seen to include a standard opamp 212 in association with a resistor scheme that generates the requisite bias current $I_{bias}$ plus a DC component $I_{dc}$ that results from the FVC 202 as stated herein before. A duplicate V to I circuit 216 is implemented to generate a copy of the DC component $I_{dc}$, that is then subtracted via a difference circuit 214 from the V to I converter 204 output consisting of the bias current $I_{bias}$ plus the DC component $I_{dc}$, such that the DC component $I_{de}$ produced at the FVC 202 output is effectively removed.

A significant advantage of the scheme illustrated in FIG. 7 is that it is very stable regardless of temperature variations, provided the resistors in the FVC 202 and the V to I converter 204 are matched. The scheme illustrated in FIG. 7 is further advantageous in that it is very simple to implement and manufacture. Simulation results by the present inventors have shown that the biasing scheme illustrated in FIGS. 5–7 provides a linear bias current over a sampling frequency range from about 10 MHz to about 100 MHz with very little variation in response to variations in temperature. The biasing scheme described herein above with respect to FIGS. 5–7 was found to consume no more than about 2.5% of the total ADC power consumption; and the same biasing scheme accounted for approximately a 80% power reduction over known ADC biasing schemes at the lowest sampling frequency (10 MHz).

In summary explanation, a power optimization scheme automatically optimizes the power consumed by a pipelined data converter with respect to the sampling frequency. The power optimization scheme employs a frequency-to-voltage converter in combination with a voltage-to-current converter to adjust bias currents with respect to the sampling frequency associated with the data converter, (e.g. ADC) such that DC components caused by the frequency-to-voltage converter are substantially eliminated and further such that data converter power consumption is substantially reduced.

In view of the above, it can be seen the present invention presents a significant advancement in the art of pipelined data converter technology. Further, this invention has been described in considerable detail in order to provide those skilled in the data communication art with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims that follow. For example, although various embodiments have been presented herein with reference to particular linear control techniques, the present invention is not so limited. It shall be understood, for example, the present invention can also be implemented using quadratic control techniques. This kind of power control technique can be extended to any analog system like sigma-delta converters, filters etc.

What is claimed is:

1. A bias circuit for an analog circuit having an operational amplifier where power consumption of the circuit is proportional to a sampling frequency comprising:
   a frequency-to-voltage converter (FVC) operational to convert a plurality of sampling frequencies to a plurality of output voltages; and
   a voltage-to-current (V to I) converter operational to convert the plurality of output voltages to a plurality of bias currents that are substantially independent of temperature and process variations, wherein the plurality of bias currents operate to bias the operational amplifiers associated with the analog circuit at levels below that required for sampling at a maximum sampling frequency such that the analog circuit power consumption is reduced with decreasing sampling frequencies.

2. The bias circuit according to claim 1 wherein the FVC comprises a lossy integrator configured to generate the plurality of output voltages such that the plurality of output voltages comprise a varying component proportional to an input frequency on top of a DC component, which lies within a common mode range of the V to I converter that it feeds into.

3. The bias circuit according to claim 2 further comprising DC component removal circuitry configured to process the plurality of bias currents such that DC components are substantially eliminated from the plurality of bias currents.

4. The bias circuit according to claim 3 wherein the FVC, the V to I converter and the DC component removal circuitry operate to consume no more than about 2.5% of the data converter total power consumption.

5. The bias circuit according to claim 1 wherein the operational amplifiers are associated with multiplying digital-to-analog converter (MDAC) portions of a pipelined data converter.

6. The bias circuit according to claim 1 wherein the FVC and the V to I converter operate to provide linear continuous bias current control.

7. The bias circuit according to claim 1 wherein the analog circuit is a pipelined data converter.

8. A data converter bias circuit for a data converter having operational amplifiers comprising:
   first converting means for converting a plurality of sampling frequencies to a plurality of output voltages; and
   second converting means for converting the plurality of output voltages to a plurality of bias currents such that the plurality of bias currents operate to bias the operational amplifiers associated with the data converter, at bias levels below that required for sampling at a maximum sampling frequency, to reduce data converter power consumption as the sampling frequencies decrease.

9. The data converter bias circuit according to claim 8 wherein the first converting means comprises a lossy integrator configured to generate the plurality of output voltages such that the plurality of output voltages comprise DC components within a common mode range associated with the operational amplifiers of the V to I converter.

10. The data converter bias circuit according to claim 8 further comprising bias current processing means for processing the plurality of bias currents such that the DC components are substantially eliminated from the plurality of bias currents.

11. The data converter bias circuit according to claim 10 wherein the first converting means, the second converting means and the bias current processing means operate to consume no more than about 2.5% of the data converter total power consumption.

12. The data converter bias circuit according to claim 8 wherein the operational amplifiers are associated with multiplying digital-to-analog converter (MDAC) portions of a pipelined data converter.

13. The data converter bias circuit according to claim 8 wherein the plurality of sampling frequencies are contained within a frequency range between about 10 MHz to about 100 MHz.

14. The data converter bias circuit according to claim 8 wherein the first converting means and the second converting means operate to provide linear continuous bias current control.

15. A method of optimizing power consumed by a pipelined analog-to-digital converter (ADC), comprising:
   providing a first converting means for converting a plurality of sampling frequencies to a plurality of output voltages and a second converting means for converting the plurality of output voltages to a plurality of bias currents; and
   biasing operational amplifiers associated with the ADC via the plurality of bias currents, at bias levels below that required for sampling at a maximum sampling frequency, to reduce ADC power consumption as the sampling frequencies decrease.

16. The method according to claim 15 further comprising the step of processing the plurality of bias currents such that DC components caused by the first converting means are substantially eliminated from the plurality of bias currents.

17. The method according to claim 15 wherein the step of biasing operational amplifiers comprises biasing operational amplifiers associated with multiplying digital-to-analog (MDAC) portions of the pipelined ADC.

18. The method according to claim 15 wherein the step of biasing operational amplifiers associated with the ADC via the plurality of bias currents to reduce ADC power consumption as the sampling frequencies decrease comprises biasing operational amplifiers associated with multiplying digital-to-analog (MDAC) portions of the pipelined ADC as the sampling frequency changes between no more than about 100 MHz and no less than about 10 MHz.

19. A bias circuit comprising:
   a frequency-to-voltage converter (FVC) operational to convert a plurality of sampling frequencies to a plurality of output voltages; and
   a voltage-to-current (V to I) converter operational to convert the plurality of output voltages to a plurality of bias currents that are substantially independent of temperature and process variations, wherein the plurality of bias currents operate to bias operational amplifiers associated with an analog circuit such that the analog circuit power consumption is reduced with decreasing sampling frequencies, wherein the FVC comprises a lossy integrator configured to generate the plurality of output voltages such that the plurality of output voltages comprise a varying component proportional to an input frequency on top of a DC component, which lies within a common mode range of the V to I converter that it feeds into.

20. The bias circuit according to claim 19 further comprising DC component removal circuitry configured to process the plurality of bias currents such that DC components are substantially eliminated from the plurality of bias currents.

21. The bias circuit according to claim 20 wherein the FVC, the V to I converter and the DC component removal circuitry operate to consume no more than about 2.5% of the data converter total power consumption.

22. A data converter bias circuit comprising:
   first converting means for converting a plurality of sampling frequencies to a plurality of output voltages; and
   second converting means for converting the plurality of output voltages to a plurality of bias currents such that the plurality of bias currents operate to bias operational amplifiers associated with the data converter to reduce data converter power consumption as the sampling frequencies decrease, wherein the first converting means comprises a lossy integrator configured to generate the plurality of output voltages such that the plurality of output voltages comprise DC components within a common mode range associated with the operational amplifiers of the V to I converter.

23. The data converter bias circuit according to claim 22 further comprising bias current processing means for processing the plurality of bias currents such that the DC components are substantially eliminated from the plurality of bias currents.

24. The data converter bias circuit according to claim 23 wherein the first converting means, the second converting means and the bias current processing means operate to consume no more than about 2.5% of the data converter total power consumption.

25. A method of optimizing power consumed by a pipelined analog-to-digital converter (ADC), comprising:
   providing a first converting means for converting a plurality of sampling frequencies to a plurality of output voltages and a second converting means for converting the plurality of output voltages to a plurality of bias currents; and
   biasing operational amplifiers associated with the ADC via the plurality of bias currents to reduce ADC power consumption as the sampling frequencies decrease, processing the plurality of bias currents such that DC components caused by the first converting means are substantially eliminated from the plurality of bias currents.

* * * * *